United States Patent [19]

Doubek et al.

[11] 4,429,271
[45] Jan. 31, 1984

[54] DIGITAL CAPACITANCE MEASURING TEST SET AND TEST CIRCUIT INCORPORATED THEREIN

[75] Inventors: Edward R. Doubek, Naperville; Marlon Z. Kasprzyk, Westchester, both of Ill.

[73] Assignee: Western Electric Company, Inc., New York, N.Y.

[21] Appl. No.: 260,443

[22] Filed: May 4, 1981

[51] Int. Cl.³ .................. G01R 11/52; G01R 27/26
[52] U.S. Cl. .................................................. 324/60 CD
[58] Field of Search .............. 324/60 R, 60 C, 60 CD

[56] References Cited

U.S. PATENT DOCUMENTS

| | | | |
|---|---|---|---|
| 2,940,037 | 6/1960 | Lide | 324/60 C |
| 3,581,196 | 5/1971 | Spaid | 324/60 R |
| 3,805,149 | 4/1974 | Delapierre | 324/60 C |
| 4,039,940 | 8/1977 | Butler | 324/60 C |
| 4,187,459 | 2/1980 | Wolfendale | 324/60 C |
| 4,320,338 | 3/1982 | Morris | 324/60 C |

OTHER PUBLICATIONS

National Semiconductors: LM555 Timer–Linear Handbook 1980–Section 9, pp. 29–34, issued Oct. 1979.
Kemna, K. H.: "Digitaler Kapazitätsmesser"–Elektronik–vol. 25–No. 11–p. 28–Nov. 76–(Germany).
Melen: "2 CMOS Gates Convert Counter into C–Meter"–Circuit–Design Idea Handbook–p. 177––Cahners Pub.–1974.
Kitchens: "Digital Capacitance Meter"—Ham Radio Mag., pp. 66–71—Aug. 1980.
Pogson: "Direct–Reading Capacitance Meter"—Electronics Australia, vol. 38–No. 7—pp. 46–49—Oct. 1976.

Primary Examiner—Stanley T. Krawczewicz
Assistant Examiner—Jose M. Solis
Attorney, Agent, or Firm—K. R. Bergum

[57] ABSTRACT

A high speed capacitance test set (10 or 60), comprised of a digital test circuit portion (11 or 11′) and a multipulse train generating portion (12 or 12′), is adapted to make exceedingly rapid, repetitive capacitance measurements, such as required when winding roll-type capacitors to a precisely ascertained final value of capacitance, determined on-the-fly.

18 Claims, 4 Drawing Figures

DIGITAL CAPACITANCE MEASURING TEST SET AND TEST CIRCUIT INCORPORATED THEREIN

FIELD OF THE INVENTION

This invention relates to a capacitance measuring test set and, more particularly, to one utilizing digital logic circuitry that allows very precise, high speed repetitive digital measurements to be made of the capacitance of a roll-type capacitor while being wound until a precise value of capacitance has been attained.

BACKGROUND OF THE INVENTION

In the manufacture of wound capacitors heretofore, such as of the metallized type, the final value of capacitance of each such capacitor has normally been controlled by one of the following three techniques: (1) winding the capacitor in accordance with a specified length of metallized film; (2) winding the capacitor in accordance with a specified number of revolutions of the winding arbor, or (3) winding the capacitor to a measured specified diameter.

Such indirect control over the final value of capacitance of a so-called "as wound" capacitor has resulted primarily because of circuit responsive speed limitations. More specifically, conventional capacitance measuring test sets employed heretofore, whether of the analog bridge-balancing type, or more recently of the digital type, have not been capable of making high speed repetitive capacitance measurements at rates on the order of 1,000 per second. Such high speed measurements are required, and must be performed "on-the-fly", i.e., dynamically, if a roll-type capacitor is to be continuously wound, at film speeds often in the range of one to 10 feet per second, until a final, precise value of capacitance has been ascertained.

In addition, prior capacitance measuring test sets, whether of the analog or digital type, have been quite expensive, typically costing in the range of three to eight thousand dollars, and have also not been adapted to make even low speed capacitance measurements with one side of the capacitor grounded. Such grounded measurements are required, of course, if capacitors of the metallized type are to be measured on-the-fly during the winding thereof on a metal arbor.

In view of the foregoing, it is readily seen that wound-to-length, wound-to-diameter or wound to a specified number of turns techniques have generally been employed in the high speed, high volume manufacture of roll-type capacitors heretofore and, in particular, those of the metallized, minaturized type. Unfortunately, such indirect control over the final value of capacitance of roll-type capacitors have often proven less than satisfactory, particularly because of the physical variations that inherently exist in film thickness over any appreciable unit length of film, as manufactured.

SUMMARY OF THE INVENTION

It, therefore, is an object of the present invention to provide a digital capacitance test set, and universal test circuit incorporated therein, of reliable, low cost design, and which can make exceedingly precise, repetitive capacitance measurements at very high speeds, such as required when winding roll-type capacitors to a precisely ascertained value of capacitance, determined on-the-fly.

In accordance with the principles of the present invention, the above and other objects are realized in one preferred embodiment of the invention wherein a clock pulse-driven monostable flip-flop of the so-called data type produces a train of sharply defined, narrow width trigger pulses which are applied to, and control the cycle time of, a digital timer. The timer is also preferably operated in a monostable mode, which allows one side of each capacitor under test to be grounded while coupled as an input thereto.

In order to take advantage of the high speed responsiveness of the trigger pulse-actuated timer, a high speed pulse-actuated switching transistor is employed to shunt each capacitor under test and, thereby, effect the rapid discharging thereof after each test period. As previously noted, there may often be as many as one thousand (or more) capacitor charging and discharging periods per second in a given high speed, high volume capacitor manufacturing operation of particular concern in accordance with the principles of the present invention.

The width of each output pulse from the trigger pulse-responsive timer is dependent on, and is directly proportional to, the value of capacitance being measured. Each such successive output pulse of variable width, together with a train of free-running clock pulses, are applied as separate inputs to a control gate. The number of pulses produced at the output of the control gate during each capacitance-dependent and, hence, variable width output pulse, are thus also seen to be directly proportional to the capacitance of a given capacitor under test, and are applied to a resettable counter to provide a correlated digital readout of the measured value of capacitance.

The output data from the counter may be optionally applied to a conventional decoder adapted to drive a digital visual display, and/or to a microcomputer for further processing into some desired format, and/or to effect the print out or temporary storage thereof.

In accordance with the principles of the present invention, the necessary pulse trains that must be generated in the composite test set in order to operate the capacitance test circuit incorporated therein may be derived from either discrete, but preferably synchronized clock or pulse generators of conventional design, or from specified output ports of a programmed microcomputer.

DETAILED DESCRIPTION OF THE INVENTION

Figure 1:
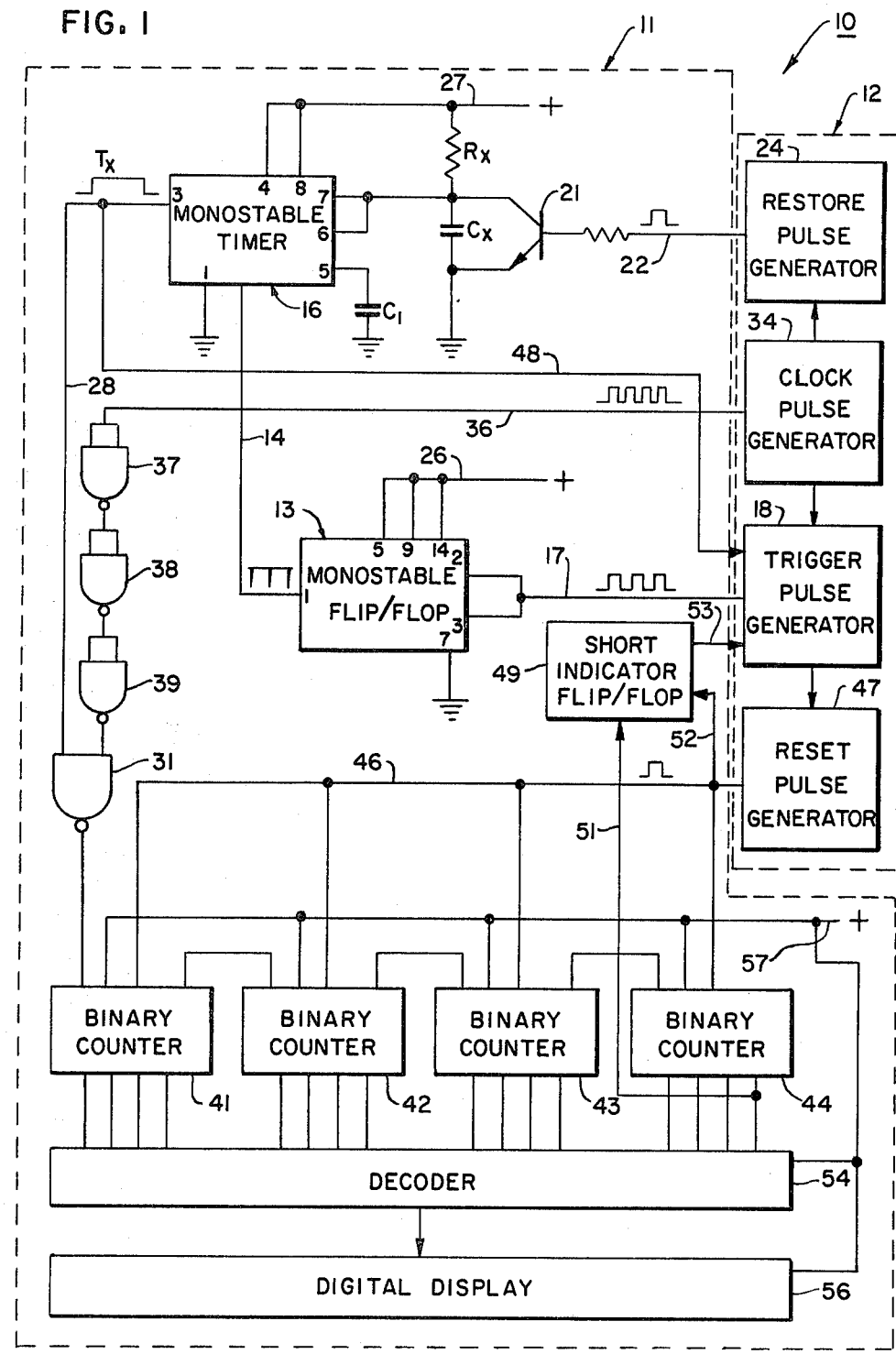
FIG. 1 is a simplified block diagram illustrating one preferred high speed digital capacitance test set and, in particular, a universal digital test circuit incorporated therein which embodies the principles of the present invention, and which is operated under the control of a plurality of pulse trains generated by separate, but preferably synchronized, pulse generators forming part of the test set.

With particular reference to FIG. 1, there is depicted a composite digitally operated capacitance test set 10 which is comprised of a test circuit portion 11 and a multi-pulse train generating portion 12, the latter controlling the operation of the test circuit in making either a single capacitance measurement or repetitive high speed measurements on a given capacitor under test. In regard to high speed repetitive capacitance measurements, of primary concern herein, they are normally only required when roll-type capacitors are to be wound until a final desired value of capacitance has been precisely ascertained. As previously noted, successive capacitance mesurements in that particular testing application must be made "on-the-fly". To that end, it should be understood that the general references hereinafter to a "capacitor under test" relate not only to a completely fabricated (wound) capacitor, but to such a capacitor at any point in time during the winding thereof when an "on-the-fly" capacitance measurement is made.

With attention now specifically directed to that portion of the test set 10 hereinafter simply referred to as the test circuit 11, it includes a pulse-actuated monostable flip-flop 13 that produces an output train of very narrow, sharply defined trigger pulses. These pulses are applied over a line 14 to, and control the cycle time of, a digital timer 16 which is wired to also operate in a monostable mode.

The flip-flop 13, in accordance with the first embodiment of the test set, is actuated in response to a train of input trigger pulses supplied thereto over a line 17 from a pulse generator 18, which may be of any conventional type. The flip-flop 13 is adapted, as wired, to transform the input trigger pulses applied thereto into extremely narrow width pulses, on the order of five (5) nano seconds in duration when generated at a rate of 1,000 cycles per second.

As will be more fully described hereinbelow, such precise, narrow width trigger pulses are necessary and critical in making repetitive high speed, precision capacitance measurements, because the minimum cycle time (or output pulse duration) of the timer 16, which determines the minimum possible value of capacitance that can be measured, is directly dependent on the width of each input pulse that triggers it, as received over line 14.

The timer 16, when wired as illustrated, also operates in a monostable mode, which has the advantage of allowing one side of a given capacitor $C_x$ under test to be grounded. This is particularly necessary when making high speed repetitive capacitance measurements during the actual winding of roll-type capacitors on a metal arbor. With the positive side of each capacitor $C_x$ under test being commonly coupled to the terminals numbered 6 and 7 of the timer 16, as illustrated, the width of each trigger pulse-initated output pulse $T_x$ appearing at the output terminal No. 3, as previously noted, is dependent on, and directly proportional to, the value of capacitance exhibited by the capacitor $C_x$ being measured at any point in time while being wound. This assumes, of course, that the width of each successive input trigger pulse applied to the timer 16 is always less than the minimum width of the output timer pulse $T_x$ generated in response thereto.

Considered more specifically, the capacitance-defining width of each output pulse $T_x$ is dynamically controlled by the time constant parameters associated with the timer 16, namely, the values of $C_x$ and the resistance of the resistor $R_x$. In the illustrative embodiment, the width of each output pulse $T_x$ is equal to 1.1 $R_x C_x$, where the value of $R_x$ is chosen so as to allow any desired number of capacitance measurements per second.

In the application of primary concern herein, wherein the capacitance of a metallized capacitor is being repetitively measured "on-the-fly" during the actual winding of the capacitor to a precise value, $T_x$ is typically chosen to be smaller than one ms ($T_x < 1$ ms), thus allowing at least one thousand (or more) capacitance measurements per second during a given capacitor winding operation. As previously noted, the utilization of prior capacitance measuring test sets have never been able to approach the measurement speed, with the associated accuracy, realized in accordance with the test sets and common digital circuit embodied herein.

In order to carry out such high speed, repetitive capacitance measurements, it is seen that not only the timer 16 must be very responsive to the narrow-width trigger pulses applied thereto, but there must be means to rapidly discharge the capacitor under test at the end of each measurement period. To this end, a pulse-actuated high speed switching transistor 21 is connected in parallel with each capacitor $C_x$ under test. As coupled to the capacitor, the transistor 21, when base-biased near the end of each measurement period, essentially provides a short-circuit to ground between the collector and emitter.

In the first illustrative test set embodiment of FIG. 1, precisely timed RESTORE pulses are supplied to the base of the switching transistor 21 over a line 22 from a discrete block or pulse generator 24. In this connection, it is preferable that all of the discrete pulse generators employed in connection with the test set 10 be synchronized in a well known conventional manner, as indicated by the interconnecting lines depicted therebetween.

By way of example only, in the preferred embodiment of the capacitance test circuit 11 per se illustrated herein, the flip-flop 13 actually comprises one half of a dual flip-flop sold under the Code No. 74121 by the Texas Instruments Company, and the timer 16 similarly comprises one half of a dual timer sold under the Code No. 555 by the same company. It is understood, of course, that there are a number of IC manufacturers who sell similar digital devices with essentially identical operating characteristics in both single and dual configurations.

The flip-flop 13 is shown connected to a positive voltage source 26, and the timer 16, capacitor $C_x$ and switching transistor 21 are shown connected to a common positive voltage source 27. In the illustrative circuit embodiment, these sources provide positive 5 volt outputs. It is understood, of course, that these voltage sources, as well as those associated with the other digital devices described hereinafter may, in fact, be replaced by a single voltage source common to all of the low voltage logic devices. The timer 16 is also shown with a decoupling capacitor $C_1$ connected from terminal numbered 5 to ground to enhance the operation thereof.

Each successive variable width output pulse $T_x$ from the timer 16 is applied over a line 28 to one input of a control gate 31. A second input to that gate is supplied from a free-running clock generator 34 over a line 36. Before being applied to the control gate 31, the clock pulses from the generator 34 are preferably fed through a plurality of serially connected gates, preferably three, as illustrated and respectively identified by the reference numerals 37, 38 and 39. These latter gates are employed to more precisely shape the leading and trailing edges of the free-running clock pulses so as to insure the reliable counting thereof after passing through the control gate 31.

It is apparent, of course, that the precise squaring of the free-running clock pulses could be effected within a given clock source itself, or by any other auxiliary pulse-squaring circuitry of conventional design, but normally at considerably greater cost than when using a serially connected gate array of the type embodied herein.

The actual number of free-running clock pulses that pass through the control gate 31 during the time that each timer output pulse $T_x$ is applied as an input thereto is, of course, also seen to be directly proportional to the capacitance of the capacitor $C_x$ then under test. This follows from the fact that it is the duration of each variable width timer output pulse $T_x$ that determines how long the control gate 31 is enabled and, hence, how many clock pulses pass therethrough. This is defined by the aforementioned circuit time constant relationship $T_x = 1.1 \, R_x \, C_x$. By adjusting $R_x$ to a value in a range of 1 to 500 kilo ohms, when measuring values of capacitance in a range of 100 pico farads to 0.5 micro farads, one thousand capacitance measurements per second can be readily made. This assumes, of course, that $T_x < 1$ ms, and that the trigger pulses applied to the input of the timer 16 each has a pulse width less than 1 ms, and are generated at a rate corresponding to the number of measurements desired per second.

Each series of capacitance determining pulses that pass through the control gate 31 during each measurement period are applied to a resettable counter which, in the form illustrated, actually comprises a stepped array of four 4-bit counters 41–44. These counters provide a correlated digital readout of each measured value of capacitance exhibited by a given capacitor $C_x$ during each measurement period. The counters are cleared after every measurement period by a RESET pulse commonly applied thereto over a line 46 from a conventional pulse generator 47 which, as illustrated, is preferably coupled to the other pulse generators, through an interconnection with the trigger pulse generator 18, so as to operate synchronously therewith.

In order to sense the end of each capacitance measurement precisely, and responsively, for high speed applications, the output $T_x$ from the monostable timer 16 is applied over a line 48 to a reset input of the trigger pulse generator 18. In operation, the latter input will remain at a high level logic state as long as a capacitance measurement is in progress, because the timer 16, as wired, is adapted to ignore all input trigger pulses applied thereto until each successive measurement has been completed. Thus, each sensed change from a high to a low level state of the pulse $T_x$ at the output of the timer 16 can be utilized as a control signal to responsively enable the trigger pulse generator 18 preparatory to commencing the generation of each successive normal width trigger pulse applied to the flip-flop 13. A similar feedback control signal is preferably employed in a second embodiment of a preferred test set 60 described in greater detail hereinbelow.

The digital test circuit 11 (as well as circuit 11' of the aforementioned second test set embodiment) also includes a capacitor-short-sensing sub-circuit comprised of a Set-Reset flip-flop 49. The Set input of this flip-flop is connected by a line 51 to the last stage output of the counter 44, with the Reset input thereof connected over a line 52, in common with the counters, to the output of the reset pulse generator 47. The output of the flip-flop 49 is connected by a line 53 to a Hold input of the trigger pulse generator 18. As thus interconnected, it is seen that the short indicator flip-flop 49 is dependent on a maximum predetermined overflow count from the last stage counter 44 to provide an indication of what is chosen to be at least representative of a capacitor short in a capacitor initially expected to exhibit a predetermined nominal value of capacitance. To this end, the maximum number of pulses capable of being counted by the counters 41–44 must obviously be initially properly chosen relative to the expected maximum period of any given timer output pulse $T_x$, and to the pulse rate of the output from the clock pulse generator 34 (or microcomputer 62), both of which outputs are applied to the control gate 31. As previously noted, the capacitance-defining width of the output pulse $T_x$ for any given nominal value of capacitance is readily controlled by simply adjusting the time constant parameter $R_x$ associated with the timer 16.

In operation, should a given capacitor under test develop a short, then the timer 16 would produce a high level output pulse $T_x$ which would have a period considerably longer than a maximum permissible period pre-calculated for $T_x$. In that event, the resulting train of pulses fed through the control gate 31 would quickly overflow the counters 41–44. The overflow output from the last stage of the counter 44 is employed to set the flip-flop 49, with the resulting change in the output state of the latter being employed as a control signal to cause the pulse generator 18 to stop sending any trigger pulses to the flip-flop 13 until either a new capacitor winding operation is to start, or until a different fabricated capacitor $C_x$ is connected to the test set for testing. The output of the flip-flop 49, if desired, could also be employed as a control signal to effect a visual display or print-out of a capacitor short condition in a well known manner, if desired.

As further illustrated in FIG. 1, the capacitance test circuit 11 embodied in the test set 10 also optionally includes a digital decoder 54 which, in turn, is coupled to a responsive numerical visual display 56, such as of the LED type. Such optional circuitry is preferably adapted to provide a numeric visual readout of the measured value of capacitance either at successive predetermined intervals, such as on the order of one each second, or simply provide a readout of the final value of capacitance in situations where the entire winding and measuring period may involve only several seconds, for example.

It becomes readily apparent, of course, that the outputs of the 4-bit counters could also be optionally connected to a microcomputer, for example, so as to allow further processing of the digitally measured capacitance data into some other desired format, and/or for temporary storage or print-out. The 4-bit counters 41–44, decoder 56 and visual display 57 are all shown connected to a common positive voltage source 57.

Figure 3:
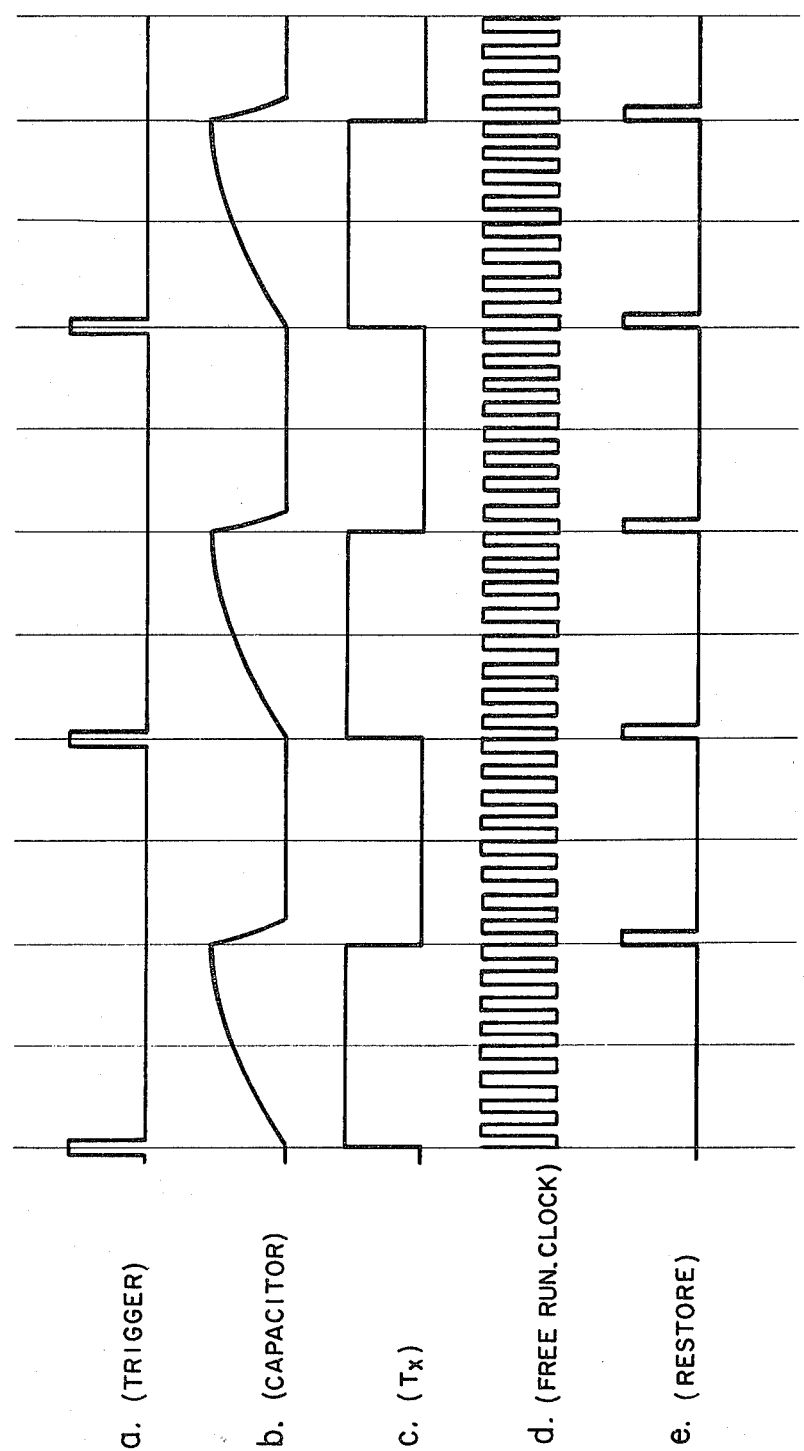
FIG. 3 is a timing chart illustrating several of the voltage versus time pulse trains involved in the operation of the test set embodiments of FIGS. 1 and 2.

FIG. 3 illustrates a voltage versus time graph of several of the most significant waveforms generated by, or employed in connection with, the operation of the capacitance test circuit 11. Considered more specifically, it is seen that each narrow width trigger pulse (waveform a), generated at the output of the flip-flop 13, and applied to the timer 16, starts a given capacitance measurement period and, in particular, the charging period for the capacitor $C_x$ under test (waveform b). The time required to fully charge the capacitor (whether only partially wound or fully wound at any point in time) is utilized as a control parameter which determined the cycle time of the triggered timer and, in particular, the duration of the output pulse $T_x$ derived therefrom (waveform c).

Figure 2:
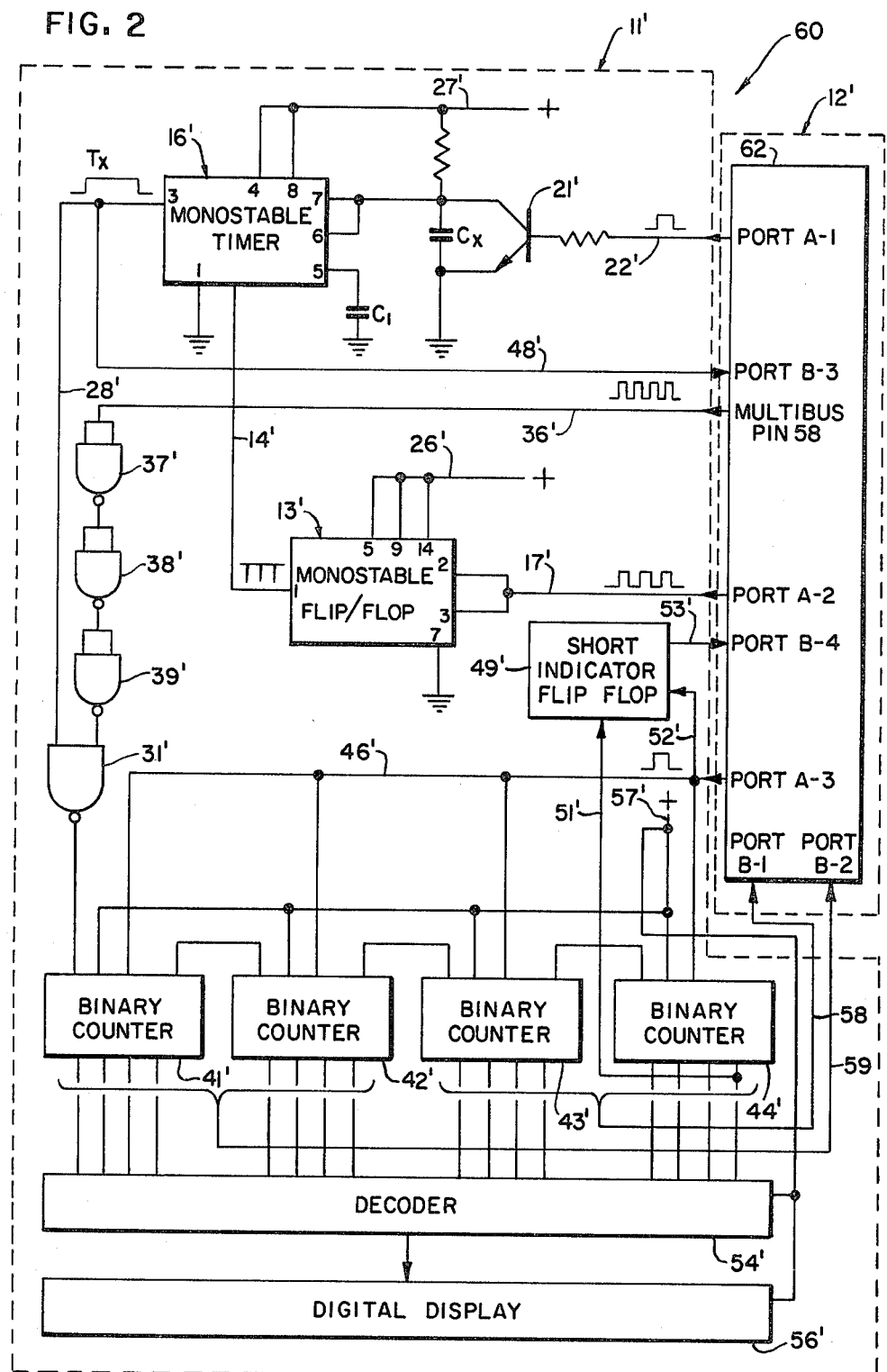
FIG. 2 is a simplified block diagram illustrating an alternative composite capacitance test set that incorporates the same capacitance test circuit depicted in FIG. 1, but with the test set of FIG. 2 distinguishing from that of FIG. 1 by utilizing a programmed microcomputer in place of discrete pulse generators to supply the necessary test circuit-controlling pulse trains.

It is each successive output pulse $T_x$ that then is used to control how many free-running clock pulses (waveform d), from the pulse generator 34 (or microcomputer 62 employed in a second embodiment, depicted in FIG. 2), are fed through the control gate 31 and counted. The actual number of pulses counted during any given measurement period, as previously noted, is directly proportional to the capacitance exhibited by the capacitor under test during that measurement period.

As indicated by waveform "e", a RESTORE pulse is applied to the switching transistor 21 at the end of each capacitance measurement period to effect the rapid discharging of the capacitor.

FIG. 2 illustrates a composite capacitance test set 60 which distinguishes over the test set 10 of FIG. 1 only with respect to the use of a microcomputer 62 rather than discrete pulse generators to produce the necessary pulse trains required to operate the test circuit. As the test circuit per se in FIG. 2 is identical to that in FIG. 1, the various components and devices embodied therein are identified by like, but primed, reference numerals.

The microcomputer 62 may be of a conventional type, and in the second illustrative test set embodiment comprises an SBC 80/20 single board microcomputer sold by the Intel Corp. This computer has two 8-bit input/output (I/O) ports designated A and B.

In using such conventional digital logic circuitry, it is well known in the art that the available I/O ports are memory mapped and, hence, any line of any port can be configured (programmed through conventional software) to be either an input or an output line. More specifically, when any line of a port is configured to be an input, it can be examined by the microcomputer, in accordance with programmed software instructions, to determine its binary logic state either momentarily or over a predetermined period of time. Conversely, when any line of a port is configured to be an output, it can be controlled, with respect to its binary state, either momentarily or over a predetermined period of time, again in accordance with programmed software instructions.

As employed in the test set 60, the microcomputer 62 is programmed to provide three separate output pulse trains on lines designated A-1, A-2 and A-3 of port A, configured as an output under software control in a well known manner.

As illustrated, the output from line A-1 supplies the RESTORE pulses applied to the base of the switching transistor 21'. The output from the line A-2 supplies the pulse train applied to the flip-flop 13', and the output from the line A-3 supplies the reset pulses applied to the binary counters 41'-44'.

The constant frequency pulse train, applied over line 36' to the control gate 31', is preferably derived directly from an internal clock incorporated in the microcomputer 62, and supplied through a multibus pin designated 58. This clock source advantageously operates at a frequency of 10 mega hertz, as desired for one particular high speed capacitance measuring application of the type described herein.

As also illustrated in FIG. 2, the outputs of the counters 41'-44' are fed back over lines 58 and 59 to input lines B-1 and B-2, respectively, of Port B, configured as an input under software control. These inputs allow the measured capacitance data to be further processed into some other desired format, and/or to be selectively temporarily stored, or re-routed to an output port line for transmission to a remote location, or to auxiliary peripheral equipment, such as a printer.

As in the first test set embodiment of FIG. 1, the output pulse $T_x$ from the timer 16' is connected by a feedback line 48' to an input port B-3 of the microcomputer 62. This allows the microcomputer, when programmed in a well known manner in accordance with the flow chart instructions set forth in FIG. 4, to periodically strobe that input and, in the absence of any sensed change in the logic state of that signal input (which would indicate the termination of a capacitance measurement period), to perform one or more other tasks, if desired, while the test circuit 11' is still performing, or attempting to perform, a given measurement. Whenever a change in logic state at the B-3 input is sensed, the microcomputer then would immediately effect the generation of a new trigger pulse at the output port A-2 to start a new capacitance measurement period.

The test set 60, as in the first test set embodiment, similarly incorporates a capacitor-short-sensing sub-circuit, which includes a Set-Reset flip-flop 49'. The output of the latter flip-flop is connected to a programmed input port B-4 of the microcomputer 62, rather than to a discrete pulse generator as in the first embodiment. Should a capacitor short develop at any time, the resulting change in the logic state of the output signal from the flip-flop 49' would cause the microcomputer 62, as programmed in accordance with the flow chart instructions set forth in FIG. 4, to immediately sense that change at the input Port B-4 (during the next succeeding strobe cycle). In response to such a sensed change, the microcomputer would then, as programmed, prevent any further trigger pulses from being generated at the output Port A-2 until either a new capacitor winding operation was to start, or until a different fabricated capacitor $C_x$ was connected to the test set for testing. The microcomputer 62 could also be readily programmed in a well known manner to effect a visual readout, or printout, of any detected capacitor shorts.

In all other respects, the test set 60 is constructed, and operates in the same manner as the test set 10 of FIG. 1 and, hence, need not be further described structurally or functionally at this point.

Figure 4:
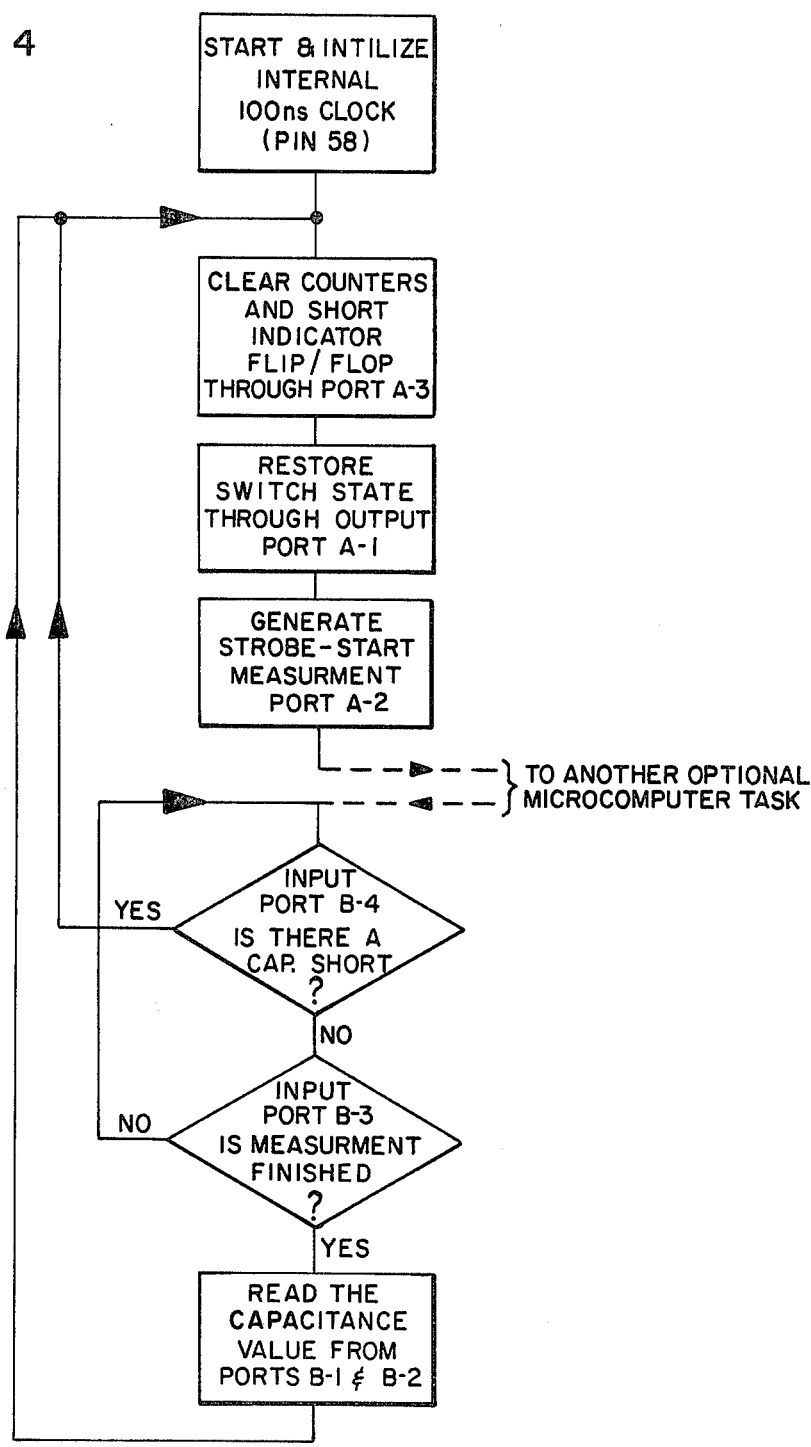
FIG. 4 is a flow chart illustrating the basic logic instructions that are involved in programming a commercially available microcomputer employed in the FIG. 2 embodiment of the test set so as to control the operation of the capacitance test circuit incorporated therein.

As referenced hereinabove, FIG. 4 discloses one illustrative preferred logic flow chart of the various aforementioned necessary instructions that must be incorporated in the source program. The latter may take any one of a number of well known and conventional forms, which form depending to a great extent on the type of microcomputer employed.

While two preferred capacitance test sets, both incorporating a common digital test circuit therein, have been disclosed herein for effecting high speed, repetitive capacitance measurements "on-the-fly" in connection with the manufacture of roll-type capacitors, it is obvious that various modifications may be made to the present illustrative embodiments of the invention, and that a number of alternative related embodiments could be devised by one skilled in the art, without departing from the spirit and scope of the invention.

What is claimed is:

1. A capacitance measuring test set comprising:

first means responsive to a first train of pulses when applied thereto for generating a second train of narrow width output trigger pulses;

second means responsive to each of said trigger pulses, and to the capacitance of a capacitor when coupled thereto and charged relative to ground, for generating a third train of output pulses, the width of each of which pulses is directly proportional to the value of capacitance of a capacitor being measured at that instant in time;

third means, responsive to each successive pulse of said third train, and to a coincident number of pulses of a fourth train of constant frequency pulses when applied thereto, for producing a fifth, time-dependent train of constant frequency pulses, the number of pulses in each of said fifth trains being dependent on the duration of the associated variable width pulse in said third train of pulses and, hence, also being proportional to the capacitance at that instant in time of a given capacitor when under measurement while coupled to said second means;

fourth means for counting the number of pulses appearing in each fifth train of pulses, and for transforming that number into a digitized readout correlated with a time-coincident value of capacitance then exhibited by a capacitor while under measurement;

fifth high speed switch means adapted to shunt a capacitor when connected to said second means, and being responsive to a given RESTORE pulse whenever applied thereto for effecting the shorting of each capacitor to ground, after having been previously charged to a predetermined voltage, at the completion of an associated capacitance measuring period;

sixth means for sensing for the completion of each capacitance measurement period, and for controlling the start of the next measurement period, and multi-pulse train generating means for supplying said first and fourth pulse trains and said RESTORE pulses.

2. A capacitance measuring test set in accordance with claim 1 further including means for biasing said first, second, fourth and fifth means, and for charging a capacitor when under measurement.

3. A capacitance measuring test set in accordance with claim 2 wherein said multi-pulse train generating means includes a separate pulse generator for each of said first and fourth pulse trains.

4. A capacitance measuring test set in accordance with claim 2 wherein said multi-pulse train generating means comprises a programmed microcomputer, with each of said first and fourth pulse trains and said RESTORE pulses being supplied from different outputs thereof.

5. A capacitance measuring test circuit comprising:

first means responsive to a first train of pulses when applied thereto for generating a second train of narrow width output trigger pulses;

second means responsive to each of said trigger pulses, and to the capacitance of a capacitor when coupled thereto and charged relative to ground, for generating a third train of output pulses, the width of each of which pulses is directly proportional to the value of capacitance of a capacitor being measured at that instant in time;

third means, responsive to each successive pulse of said third train, and to a coincident number of pulses of a fourth train of constant frequency pulses when applied thereto, for producing a fifth time-dependent train of constant frequency pulses, the number of pulses in each of said fifth trains being dependent on the duration of the associated variable width pulse in said train of pulses and, hence, also being proportional to the capacitance at that instant in time of a given capacitor when under measurement while coupled to said second means;

fourth means for counting the number of pulses appearing in each fifth train of pulses, and for transforming that number into a digitized readout correlated with a time-coincident value of capacitance then exhibited by a capacitor while under measurement;

fifth means for sensing for the completion of each capacitance measurement period, and for controlling the start of the next measurement period, and sixth means for sensing for a predetermined overflow count of pulses from said fourth means, with said sensed condition being chosen to be at least representative of a capacitor short in a capacitor initially expected to exhibit a predetermined nominal value of capacitance, and for providing a control signal to selectively indicate the existence of each such representative short, and to at least delay the start of the next measurement period until a new capacitor is coupled to said second means for testing.

6. A capacitance measuring test circuit comprising:

first means responsive to a first train of pulses when applied thereto for generating a second train of narrow width output trigger pulses;

second means responsive to each of said trigger pulses, and to the capacitance of a capacitor when coupled thereto and charged relative to ground, for generating a third train of output pulses, the width of each of which pulses is directly proportional to the value of capacitance of a capacitor being measured at that instant in time;

third means, responsive to each successive pulse of said third train, and to a coincident number of pulses of a fourth train of constant frequency pulses when applied thereto, for producing a fifth time-dependent train of constant frequency pulses, the number of pulses in each of said fifth trains being dependent on the duration of the associated variable width pulse in said third train of pulses and, hence, also being proportional to the capacitance at that instant in time of a given capacitor, when under measurement while coupled to said second means;

fourth means for counting the number of pulses appearing in each fifth train of pulses and transforming that number into a digitized readout correlated with a time-coincident value of capacitance then exhibited by a capacitor while under measurement;

fifth high speed switch means adapted to shunt a capacitor when connected to said second means-timer, and being responsive to a given RESTORE pulse whenever applied thereto for effecting the shorting of each such capacitor to ground, after having been previously charged to a predetermined voltage, at the completion of an associated capacitance measuring period, and sixth means for sensing that a capacitor condition that is chosen to be at least representative of a capacitor short in a capacitor initially expected to exhibit a predetermined nominal value of capacitance, and for providing a control signal to selectively indicate the existence of each such representative short, and to at least effect the delay of the start of the next measurement period until a new capacitor is coupled to said second means for testing.

7. A capacitance measuring test circuit in accordance with claim 6 wherein said first means includes a monostable flip-flop, wherein said second means comprises a timer operated in a monostable mode, and wherein said fourth means includes digital counter means.

8. A capacitance measuring test circuit in accordance with claim 7 wherein said fourth means includes resettable digital counter means, and digital display means responsive to the output of said counter means for providing a direct visual numerical readout of the value of capacitance exhibited by a given capacitor when under measurement.

9. A capacitance measuring test circuit in accordance with claim 7 wherein said first means further includes a pulse generator for producing the first train of pulses applied to said associated monostable flip-flop.

10. A capacitance measuring test circuit in accordance with claim 6 further including means for applying timed RESTORE pulses to said switch means.

11. A capacitance measuring test circuit in accordance with claim 7 wherein the first train of pulses to be applied to said first-means monostable flip-flop, wherein the fourth train of constant frequency pulses to be applied to said third means and, wherein said RESTORE pulses to be applied to said switch means, are all respectively generated by separate, but sychronized, pulse generators.

12. A capacitance measuring test circuit in accordance with claim 11 wherein said fourth means further includes digital display means for providing a direct visual numerical readout of the value of capacitance exhibited by a given capacitor when under measurement.

13. A capacitance measuring test circuit in accordance with claim 7 wherein said first train of pulses to be applied to said first-means monostable flip-flop are generated by, and supplied from an output of, a programmed microcomputer.

14. A capacitance measuring test circuit in accordance with claim 13 wherein said RESTORE pulses are generated by, and supplied to said switch means from an output of, said programmed microcomputer.

15. A capacitance measuring test circuit in accordance with claim 7 wherein the first train of pulses to be applied to said first-means monostable flip-flop, wherein the fourth train of constant frequency pulses to be applied to said third means and, wherein said RESTORE pulses to be applied to said switch means, are all respectively generated by, and supplied from different outputs of, a programmed microcomputer.

16. A capacitance measuring test circuit in accordance with claim 14 wherein the fourth train of constant frequency pulses to be applied to said third means are supplied from an output of said programmed microcomputer, and wherein said test circuit further comprises pulse squaring means through which said fourth train of pulses are directed before being applied to said third means, the latter comprising a logic gate.

17. A capacitance test circuit in accordance with claim 16 wherein said fourth means includes resettable digital counter means, a digital decoder connected to said counter means and digital display means connected to said decoder for providing a direct visual numerical readout of the value of capacitance exhibited by a capacitor when under measurement, wherein said microcomputer generates resettable output pulses at a programmed output thereof for resetting said counter means, and wherein the digitized output of said counter means is applied as an input to said microcomputer selectively for storage, further processing and subsequent outputting under programmed control.

18. A capacitance measuring test set in accordance with claim 1 further including:

means for sensing for a predetermined overflow count of pulses from said fourth means, with said sensed condition being chosen to be at least representative of a capacitor short in a capacitor initially expected to exhibit a predetermined nominal value of capacitance, and for providing a control signal to selectively indicate the existence of each such representative short, and to at least effect the delay of the start of the next measurement period until a new capacitor is coupled to said second means for testing.

* * * * *